(12) United States Patent
Bulou et al.

(10) Patent No.: US 11,756,770 B2
(45) Date of Patent: Sep. 12, 2023

(54) POST-DISCHARGE PLASMA COATING DEVICE FOR WIRED SUBSTRATES

(71) Applicant: LUXEMBOURG INSTITUTE OF SCIENCE AND TECHNOLOGY (LIST), Esch-sur-Alzette (LU)

(72) Inventors: Simon Bulou, Metz (FR); Patrick Choquet, Longeville les Metz (FR); Thomas Gaulain, Esch-sur-Alzette (LU); Mathieu Gerard, Cutry (FR)

(73) Assignee: Luxembourg Institute of Science and Technology (LIST), Esh-sur-Alzette (LU)

( * ) Notice: Subject to any disclaimer, the term of this patent is extended or adjusted under 35 U.S.C. 154(b) by 37 days.

(21) Appl. No.: 16/333,827

(22) PCT Filed: Sep. 8, 2017

(86) PCT No.: PCT/EP2017/072635
§ 371 (c)(1),
(2) Date: Mar. 15, 2019

(87) PCT Pub. No.: WO2018/050562
PCT Pub. Date: Mar. 22, 2018

(65) Prior Publication Data
US 2019/0259577 A1   Aug. 22, 2019

(30) Foreign Application Priority Data

Sep. 15, 2016   (LU) ......................................... 93222

(51) Int. Cl.
*H01J 37/32*   (2006.01)
*C23C 16/54*   (2006.01)
(Continued)

(52) U.S. Cl.
CPC ...... *H01J 37/32348* (2013.01); *C23C 16/452* (2013.01); *C23C 16/503* (2013.01);
(Continued)

(58) Field of Classification Search
CPC ..... H05H 2001/2443; H05H 2001/245; H05H 2001/2456; H05H 2001/2462;
(Continued)

(56) References Cited

U.S. PATENT DOCUMENTS

2005/0236374 A1   10/2005   Blankenship
2006/0196230 A1   9/2006   Park et al.
(Continued)

FOREIGN PATENT DOCUMENTS

| DE | 102012104224 A1 * | 11/2013 | ............... B08B 7/00 |
| DE | 102012104224 A1 | 11/2013 | |
| WO | 2014191012 A1 | 12/2014 | |

OTHER PUBLICATIONS

"support, v." OED Online, Oxford University Press (2022), available at www.oed.com/view/Entry/194674. (Year: 2022).*
(Continued)

*Primary Examiner* — Mikhail Kornakov
*Assistant Examiner* — Richard Z. Zhang
(74) *Attorney, Agent, or Firm* — Sandberg Phoenix & von Gontard PC

(57) ABSTRACT

A post-discharge plasma coating device for a wired substrate comprising an inner tubular electrode on an inner tubular wall for receiving the substrate and a precursor moving axially in a working direction; an outer tubular electrode coaxial with, and surrounding, the inner tubular electrode. The inner and outer electrodes are configured to be supplied with an electrical power source for producing a plasma when a plasma gas is supplied between the electrodes and is thereby excited, the plasma excited gas flowing axially in the
(Continued)

working direction and reacting with the precursor in a coating area at the end of the inner tubular wall in the direction. The inner tubular wall extends axially towards the coating area at least until, in various instances beyond, the end of the outer electrode, in the working direction and at least one dielectric tubular wall extends axially between the inner tubular electrode and the outer tubular electrode.

17 Claims, 2 Drawing Sheets

(51) Int. Cl.
    *C23C 16/452*     (2006.01)
    *C23C 16/503*     (2006.01)
    *H05H 1/24*     (2006.01)

(52) U.S. Cl.
    CPC ........ *C23C 16/545* (2013.01); *H01J 37/3277* (2013.01); *H01J 37/32357* (2013.01); *H01J 37/32568* (2013.01); *H05H 1/2443* (2021.05)

(58) Field of Classification Search
    CPC ... H05H 2001/2412; H05H 2001/2418; H05H 2001/2425; H05H 1/00–54; H05H 1/2431; H05H 1/2406–2465; H05H 2245/40; H05H 2245/42; H01J 37/32348; H01J 37/32568; H01J 37/32733; H01J 37/32752; H01J 37/32761; H01J 37/3277; H01J 37/00–36; C23C 16/50; C23C 16/503; C23C 16/452; C23C 16/545; C23C 4/134; C23C 8/36; C03C 25/6293
    See application file for complete search history.

(56) References Cited

U.S. PATENT DOCUMENTS

2008/0145553 A1*   6/2008  Boulos ................... B05D 3/141
                                                 427/447
2011/0101862 A1*   5/2011  Koo ..................... H01J 37/3244
                                                  315/111.21

OTHER PUBLICATIONS

International Search Report for corresponding PCT/EP2017/072635, dated Nov. 14, 2017.

\* cited by examiner

POST-DISCHARGE PLASMA COATING DEVICE FOR WIRED SUBSTRATES

The present invention is the US national stage under 35 U.S.C. § 371 of International Application No. PCT/EP2017/072635, which was filed on Sep. 8, 2017, and which claims the priority of application LU 93222 filed on Sep. 15, 2016, the content of which (text, drawings and claims) are incorporated here by reference in its entirety.

FIELD

The invention is directed to a post-discharge plasma coating device. More specifically, the invention is directed to a post-discharge plasma coating device for wired substrates.

BACKGROUND

Prior art patent document published WO2014/191012 A1 discloses a device and a method for treating an electrically conductive wire using a post-discharge plasma. The plasma device comprises a plasma nozzle having a discharging chamber with a nozzle opening for the outlet of a plasma jet in a post-discharge area for the treatment of the wire. The discharging chamber comprises an inner tube in which a conductive wire to treat can be guided, the tube being made of electrically insulation material and adjacent to the post-discharge area. The discharging chamber comprises an internal tubular electrode surrounding a portion of the tube and an external tubular electrode coaxial with the internal electrode and extending axially along the discharging chamber towards the nozzle opening. A gas is injected between the two electrodes and a high-frequency voltage is applied to the internal electrode thus creating electric arcs in the discharging chamber producing a high energy density plasma. Moreover, electric arcs can extend until the post-discharge area and react with the conductive wire. The inner electrode must be distant from the post-discharge area otherwise it would create electric arc with the conductive wire substrate. Also high voltage and current are supplied to the electrode in view of the radial distance between them and the necessary distance between the inner electrode and the post-discharge area. This device is thereby not adapted for organic coating and heat-sensitive substrates because the high energy density plasma could degrade the precursor of the coating and the substrate.

Prior art patent document published US2005/0236374 A1 discloses a plasma device for processing a wire. The device comprises a conductive contact tube surrounding a longitudinal path receiving the wire. A dielectric sleeve adjacent to the contact tube surrounds the wire and defines with said wire an annular gas passage. The gas is trains by means of an adjacent inlet to the contact tube and a chemical precursor is injected in the passage of the wire. An electrode sleeve is around the dielectric sleeve so a high-frequency, high dielectric signal between said electrode and the conductive tube creates a dielectric barrier discharge for creating the plasma. The chemical precursor is directly in contact with the plasma which can promote the fragmentation of the precursor thus rendering the processing less effective. This device is not adapted for heat-sensitive precursors and substrates.

SUMMARY

The invention provides a solution to overcome at least one shortcoming of the above mentioned prior art. More specifically, the invention solves the technical problem of providing a device for a continuous, homogeneous and efficient organic or inorganic post-discharge plasma coating on a conductive or non-conductive wired substrate, more particularly on a heat-sensitive substrate.

The invention is directed to a post-discharge plasma coating device for a wired substrate, comprising an inner tubular electrode on an inner tubular wall for receiving the substrate and a precursor moving axially in a working direction; an outer tubular electrode coaxial with, and surrounding, the inner electrode; wherein the inner and outer electrodes are configured to be supplied with an electrical power source for producing a plasma when a plasma gas is supplied between the electrodes and is thereby excited, the plasma excited gas flowing axially in the working direction and reacting with the precursor in a coating area at the end of the inner tubular wall in the direction; remarkable in that the inner tubular electrode extends axially towards the coating area at least until, in various instances beyond, the end of the outer electrode in the working direction and in that at least one dielectric tubular wall extends axially between the inner electrode and the outer electrode.

According to various embodiments, the coating area is such that the plasma excited gas can contact directly the substrate.

According to various embodiments, the coating area is directly adjacent to the inner tubular wall.

According to various embodiments, the at least one dielectric tubular wall extends axially beyond the outer electrode in the working direction.

According to various embodiments, the inner tubular electrode surrounds the inner tubular wall or is formed by the inner tubular wall.

According to various embodiments, the inner tubular electrode is formed by the inner tubular wall made of electrical conductive material or a combination of electrical conductive and dielectric material.

According to various embodiments, the inner tubular electrode surrounds or is attached to the inner tubular wall.

According to various embodiments, the inner tubular electrode extends axially along a portion of the inner tubular wall, the portion being up to 100%.

According to various embodiments, the dielectric tubular wall or one of the at least one dielectric tubular wall supports the outer electrode.

According to various embodiments, the outer tubular electrode extends axially along a portion of the dielectric tubular wall, the portion being in various instances at least 10% and up to 100%.

According to various embodiments, the at least one dielectric tubular wall is made of a dielectric material including but not limited to material taken from the following list: quartz, alumina, silicon dioxide, glass, and any combination thereof.

According to various embodiments, the dielectric tubular wall supporting the outer electrode is a first dielectric tubular wall, the device comprising a second dielectric tubular wall extending between the inner tubular electrode and the first dielectric tubular wall.

According to various embodiments, an annular space is provided between the dielectric tubular wall supporting the outer electrode and the inner tubular electrode or between the first and the second dielectric tubular walls, the device comprising a connector configured for supplying the space with the plasma gas for producing the plasma, the connector being axially located opposite to the coating area.

According to various embodiments, the plasma is created from non-condensable gas which may include, but are not limited to, argon, helium, nitrogen, oxygen, hydrogen, and any combination thereof.

According to various embodiments, the precursor comprises at least one chemical product.

According to various embodiments, the inner tubular wall is movable axially relative to the rest of the device so as to axially displace the coating area.

According to various embodiments, the device further comprises the electrical power source configured for supplying a pulsed or alternating high voltage, the device being configured so that the inner electrode is in various instances to be electrically grounded and the outer electrode in various instances electrically supplied with the high-voltage.

According to various embodiments, the high-voltage of the electrical power source is comprised between 1 and 50 kV and/or the current supplied by the source to the electrode is less than 1000 mA.

According to various embodiments, the device further comprises a confinement tube surrounding the coating area.

The invention is also directed to a method for a continuous coating of a wired substrate with a post-discharge plasma coating device with an inner tubular electrode and an outer tubular electrode, the method, comprising moving the substrate and a precursor in a working direction through the inner electrode while supplying the outer and inner electrodes to a high-voltage and supplying a plasma gas between the electrodes, so as to produce a plasma excited gas that flows axially towards a coating area where the plasma excited gas chemically reacts with the precursor on the substrate; remarkable in that the post-discharge plasma coating device is according to the invention.

According to various embodiments, the precursor is injected in a liquid or in a gaseous phase with a carrier gas.

According to various embodiments, the mixture of the precursor and the carrier gas is flowing through the inner tubular wall at a gas speed inferior, equal or superior, in various instances at a gas speed equal or superior to the gas speed of the plasma gas and plasma excited gas.

According to various embodiments, the substrate is dipped or sprayed or impregnated with the precursor before moving through the inner tubular wall.

The invention is particularly interesting in that the arrangement avoids the impact of high energy plasma particles on precursor molecules as well as on the substrate to be coated. In addition, it allows the deposition on heat-sensitive substrates. The substrate is not directly in contact with the plasma and its coating is not impacted by electric filaments present in the discharge. The coaxial configuration allows producing a homogenous plasma and a homogeneous coating even on complex surfaces. The device can be used with conductive and non-conductive substrates. The device allows the deposition of inorganic, organic, or organic/inorganic thin films owing to the post discharge configuration and low temperature deposition. Inorganic materials that can be deposited using this device can be, but are not limited to $SiO_2$, $TiO_2$, $SiO_2/TiO_2$. Organic material that can be deposited using this device comprise functional materials composed of reactive groups, such as hydroxyl groups, carboxylic groups, amine groups, epoxide groups, acrylic groups, sulfurized groups, chlorinated groups. Inorganic/organic structures than can be obtained comprises, but are not limited to $SiOxCyHz$, $SiOxCyHz/TiO_2$.

DRAWINGS

DETAILED DESCRIPTION

Figure 1:
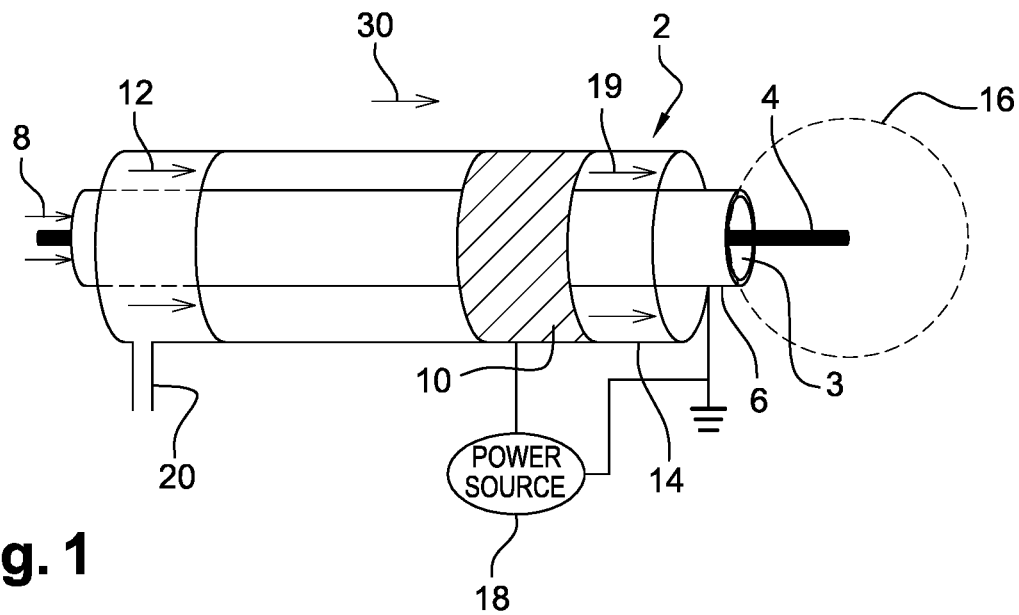
FIG. 1 is a schematic representation of the post-discharge plasma coating device in accordance with various embodiments of the present invention.
Figure 2:
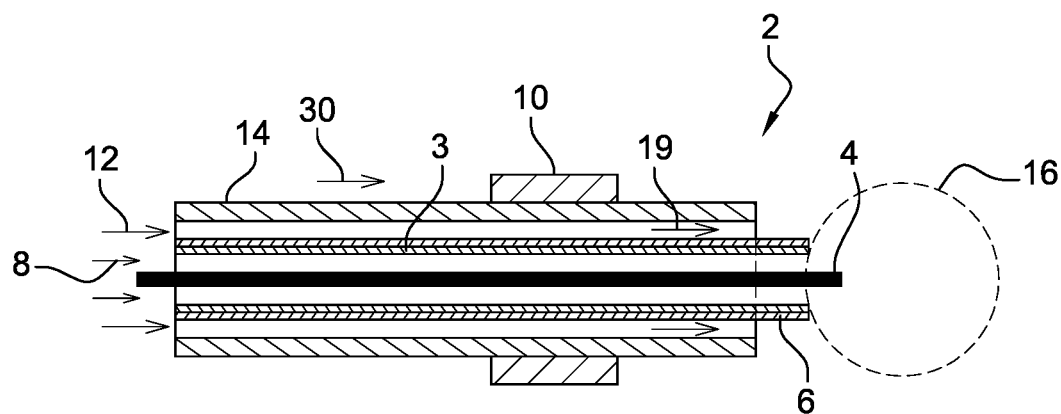
FIG. 2 is a longitudinal sectional view of the post-discharge plasma coating device according to various embodiments of the present invention.
Figure 3:
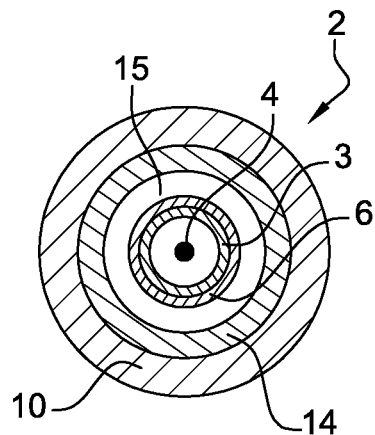
FIG. 3 is a cross sectional view of the post-discharge plasma coating device according to various embodiments of the present invention.

The FIGS. 1 to 3 do not define the precise proportions of the elements.

With reference to the attached FIGS. 1, 2 and 3, reference 2 shows a post-discharge plasma coating device according to the present invention. The post-discharge plasma coating device 2 has a tubular shape and comprises an inner tubular wall 3 configured to receive a wired substrate 4 to be coated. The wired substrate 4 can move axially through the inner tubular wall 3 in a working direction 30 in order to be coated in a coating area 16 represented here in dotted lines. The coating area 16 is adjacent to the inner tubular wall 3 and is such that a plasma excited gas 19 can contact directly the substrate 4. The plasma excited gas 19 (i.e., plasma gas that passes through the plasma zone of the device and that has been activated by energetic species from the plasma) flows axially in the working direction 30 and reacts with a precursor 8 in the coating area 16. The precursor 8 is in various instances in the form of a precursor gas flow. The coating occurs in the coating area 16 where the substrate 4, the plasma excited gas 19 and the precursor 8 mix.

The inner tubular wall 3 is designed to separate the plasma excited gas 19 and the precursor gas flow 8, as well as to protect the substrate 4 from direct plasma interaction. The inner tubular wall 3 is made of non-porous material. The inner tubular wall 3 is directly surrounded by an inner tubular electrode 6, made of conductive material as shown in FIGS. 2 and 3. However, in various embodiments, the inner tubular wall 3 can form the inner electrode 6. For that, the inner tubular wall 3 could be made of electrical conductive material or a combination of electrical conductive material and dielectric material.

The inner tubular electrode 6 is surrounded by a coaxial outer tubular electrode 10. The two electrodes 6 and 10 are configured to be supplied with an electrical power source in order to produce a plasma when a plasma gas 12 is supplied between them, the plasma gas being thereby excited. The inner tubular electrode 6 extends axially towards the coating area 16 at least until, in various instances beyond, an end of the outer electrode 10. The end of the outer electrode is in the working direction 30. The plasma excited gas 19 appears at the end of the outer electrode 10, in the working direction 30. The coating area 16 corresponds to an area where the plasma excited gas 19, the substrate 4 and the precursor 8 mix.

The inner tubular wall 3 is movable axially relative to the rest of the device 2 so as to axially displace the coating area 16.

The device further comprises at least one dielectric tubular wall 14 extending axially between the two electrodes 6 and 10. This electrode composition, so called dielectric barrier (DBD) discharges avoids the formation of electric arcs and allows the production of a homogenous low energy density plasma. As an exemplary embodiment, a dielectric tubular wall 14 extends axially between the two electrodes 6 and 10 and supports the outer electrode 10. The outer electrode 10 extends axially along a portion of the dielectric tubular wall 14, in various instances at least 10% and up to 100% of the length of the dielectric tubular wall. Optionally, a second dielectric tubular wall (not represented), on and around the inner tubular electrode 6 can be used to form a DBD discharge with a symmetric configuration with two dielectrics.

The dielectric tubular walls are made of a dielectric material including but not limited to material taken from the following list: quartz, alumina, silicon dioxide, glass, and any combination thereof.

An annular space 15 or passage (represented in FIG. 3) is provided between the inner tubular electrode 6 and the dielectric tubular wall 14 supporting the outer tubular electrode 10, in order to receive the gas to be ionised. The annular space 15 can have approximately a width of 0.5 to 5 mm. The device 2 also comprises a connector 20 configured for supplying the annular space 15 with the plasma gas 12 for producing the plasma. The connector 20 (represented in FIG. 1) is axially located opposite to the coating area 16. In the case of a second dielectric tubular wall, the annular space can be between the dielectric tubular supporting the outer electrode, the dielectric tubular wall being a first dielectric tubular wall, and the second dielectric tubular wall.

The device 2 further comprises an electrical power source 18 (represented in FIG. 1) configured for supplying a pulsed or alternating high voltage in order to ionize the plasma gas 12 flowing through the annular space 15. The electrical power source 18 is further configured so that the inner electrode 6 is electrically grounded and the outer electrode 10 is electrically supplied with the high voltage. The high voltage of the electrical power source 18 is in various instances comprised between 1 and 50 kV, for example between 1 and 15 kV and/or the current supplied by the power source to the electrode 10 is less than 1000 mA. The frequency of the power source is comprised between 1 kHz and 100 kHz. In general, the power source 18 will produce a high voltage with a low frequency in order to create the plasma. In this manner, when a high voltage is applied to the outer electrode 10, the plasma is created by the phenomenon known as dielectric barrier discharge. A plasma is thus created in between the inner tubular electrode 6 and the dielectric tubular wall 14 supporting the outer electrode. The plasma excited gas 19 will flow axially towards the coating area 16 where the plasma excited gas 19 chemically reacts with the precursor 8 and the substrate 4.

In order to improve the homogeneity of the coating, the precursor 8 is injected coaxially with the substrate 4 in the inner tubular wall 3. The precursor is in various instances an organic chemical precursor possibly comprising non-organic groups (composed of atoms including but not limited to the list below: Si, Ti, Zr, Zn, Co, Fe, Pt, Pd, S, B, Cl, P, Mg, Ca, Au, Ag), with grow functional interfaces, which allows a good adhesion to the surface of the substrate and exhibits chemical groups of interest. The precursor 8 can be injected in the inner tubular wall 3 in a liquid or gaseous phase, in various instances with a carrier gas. The precursor is in various instances composed of C and H and may include functional groups, such as alcohol, alkane, allyl, amide, amine, carboxylic, epoxyde, etc. and/or unsaturations. The precursor can be for example hexamethyldisiloxane, methyl methacrylate, titanium tetraisopropoxyde, aminopropyltriethoxysilane, the compounds carried in gas comprising but not limited to, argon, helium, nitrogen, oxygen, hydrogen, and any combination thereof. In order to prevent the damages induced by high energy species of the plasma (i.e. electrons, ions), the precursor is injected in the inner tubular wall 3 at whatever flow speed, along with a carrier gas flow. The mixture composed of precursor 8 and carrier gas is injected at a gas speed inferior, equal or superior, in various instances equal or superior to the gas speed of the plasma gas 12 and plasma excited gas 19. Alternatively, the substrate 4 can be previously dipped or sprayed or impregnated with the precursor before moving through the inner tubular wall 3.

Optionally, an external confinement tube (not represented) can be setup in the coating area 16 in order to confine in a limited volume the mixture of the plasma excited gas 19, the chemical precursor 8 and the substrate 4. The confinement tube is in various instances at the end of the outer tubular wall 14.

The post-discharge plasma coating device 2 can have for example a dielectric tubular wall 14 supporting the outer electrode made of glass with an inner diameter of 10 mm. The outer tubular electrode 10 can have a length of 100 mm and the inner tubular wall 3 can have an outer diameter of 6 mm. The thickness of the inner tubular electrode 6 and outer tubular electrode 10 is comprised between 1 and 1000 µm, typically 100-300 µm. The annular space 15 between the dielectric tubular wall 14 supporting the outer electrode and the inner tubular electrode can be of 2 mm, the annular space corresponds to the space between the external diameter of the inner tubular electrode and the internal diameter of the dielectric tubular wall supporting the outer electrode.

Figure 4:
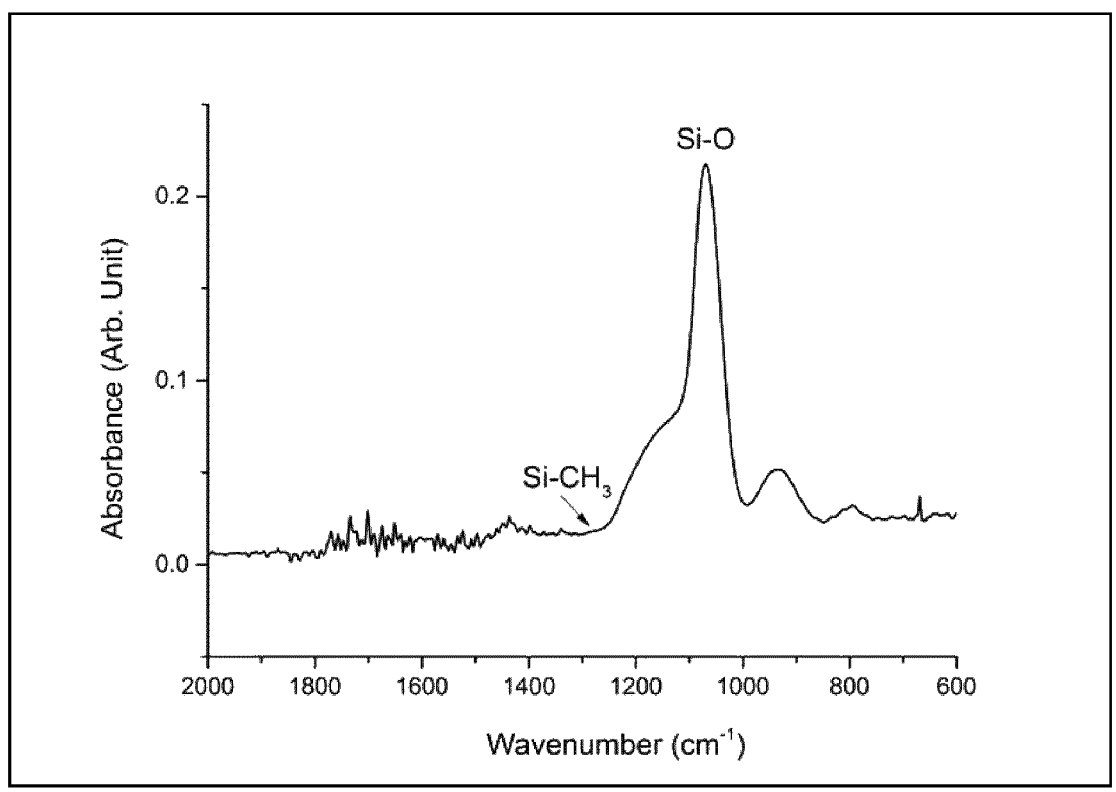
FIG. 4 is a FTIR spectrum of coating obtained with HMDSO injection in a $N_2$ plasma post discharge according to various embodiments of the present invention.

Two coatings were performed on metallic wires. A first coating with a monomer of HMDSO (Hexamethyldisiloxane) was performed on a wired substrate made of stainless steel. Nitrogen was used as the plasma gas with a flow speed of 50 l/s. The metallic wire was moved in the device at a speed of 100 cm/min and the HMDSO monomer was injected in the device with a vector gas or carrier gas at a flow speed of 10 µl/min. The power supplied by the power source is of 80 W and the frequency of the signal is of 60 kHz. A "SiO$_2$ like" coating with very weak "Si—CH3" absorption bands was observed on the substrate with a Bruker Vertex 70 FTIR spectrometer and the results are represented in FIG. 4.

Figure 5:
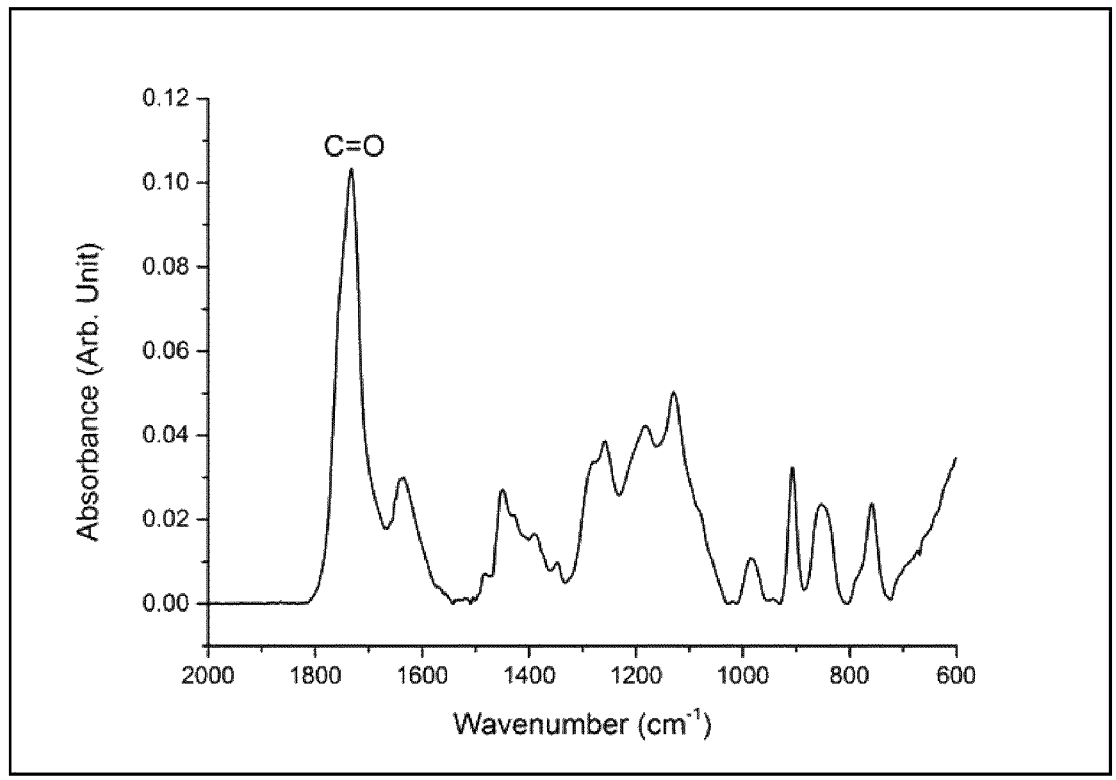
FIG. 5 is a FTIR spectrum of coating obtained with MMA injection in a $N_2$ plasma post discharge according to various embodiments of the present invention.

A second coating was performed with a monomer of methyl methacrylate (MMA) on a wired substrate made of stainless steel. Nitrogen was used as the plasma gas with a flow speed of 50 l/s. The metallic wire was moved in the device at a speed of 100 cm/min and the methyl methacrylate monomer was injected at a flow of 50 µl/min in the device with a carrier gas at a flow speed of 10 µl/min. The power supplied by the power source is of 50 W and the frequency of the signal is of 60 Hz. The coating was analysed with the Bruker Vertex 70 FTIR spectrometer and the results are represented in FIG. 5. An organic coating with functional groups C=O was observed which revealed that the coating occurred. The monomers used are taken as examples and are not limited.

The invention claimed is:

1. A post-discharge plasma coating device for a wired substrate, said device comprising:
    an inner tubular electrode on an inner tubular wall for receiving the wired substrate and a precursor moving axially in a working direction; and
    an outer tubular electrode coaxial with, and surrounding, the inner tubular electrode;

wherein the inner tubular electrode and the outer tubular electrode are configured to be supplied with an electrical power source for producing a plasma when a plasma gas is supplied between the inner tubular electrode and the outer tubular electrode and is thereby excited, the plasma gas flowing axially in the working direction and reacting with the precursor in a coating area at an end of the inner tubular wall in the working direction;

wherein the inner tubular electrode extends axially towards the coating area at least until an end of the outer tubular electrode in the working direction and wherein at least one dielectric tubular wall extends axially between the inner tubular electrode and the outer tubular electrode;

wherein the at least one dielectric tubular wall supports the outer tubular electrode;

wherein the at least one dielectric tubular wall extends axially beyond the outer tubular electrode in the working direction; and wherein the inner tubular electrode extends axially towards the coating area beyond the end of the outer tubular electrode and an end of the at least one dielectric tubular wall, in the working direction.

2. The post-discharge plasma coating device according to claim 1, wherein the coating area is such that the plasma gas can contact directly the wired substrate.

3. The post-discharge plasma coating device according to claim 1, wherein the coating area is directly adjacent to the inner tubular wall.

4. The post-discharge plasma coating device according to claim 1, wherein the inner tubular electrode surrounds the inner tubular wall or is formed by the inner tubular wall.

5. The post-discharge plasma coating device according to claim 1, wherein the inner tubular electrode extends axially along a portion of the inner tubular wall, the portion being up to 100%.

6. The post-discharge plasma coating device according to claim 1, wherein the outer tubular electrode extends axially along a portion of the at least one dielectric tubular wall, the portion being at least 10%.

7. The post-discharge plasma coating device according to claim 1, wherein the at least one dielectric tubular wall is made of a dielectric material including but not limited to material taken from the following list: quartz, alumina, silicon dioxide, glass, and any combination thereof.

8. The post-discharge plasma coating device according to claim 1, wherein the dielectric tubular wall supporting the outer tubular electrode is a first dielectric tubular wall, the device comprising a second dielectric tubular wall extending between the inner tubular electrode and the first dielectric tubular wall.

9. The post-discharge plasma coating device according to claim 8, wherein an annular space is provided between the first dielectric tubular wall and the second dielectric tubular wall, the device comprising a connector configured for supplying the annular space with the plasma gas for producing the plasma, the connector being axially located opposite to the coating area.

10. The post-discharge plasma coating device according to claim 1, wherein the inner tubular wall is movable axially relative to the rest of the device so as to axially displace the coating area.

11. The post-discharge plasma coating device according to claim 1, further comprising the electrical power source, the electrical power source being configured for supplying a pulsed or alternating high voltage, the device being configured so that the inner tubular electrode is to be electrically grounded and the outer tubular electrode electrically supplied with the high voltage.

12. The post-discharge plasma coating device according to claim 11, wherein at least one of the pulsed high voltage and the alternating high voltage of the electrical power source is comprised between 1 and 50 kV and a current supplied by the electrical power source to the outer tubular electrode is less than 1000 mA.

13. The post-discharge plasma coating device according to claim 1, further comprising a confinement tube surrounding the coating area.

14. A method for a continuous coating of a wired substrate with a post-discharge plasma coating device comprising an inner tubular electrode on an inner tubular wall for receiving the wired substrate and a precursor moving axially in a working direction; and an outer tubular electrode coaxial with, and surrounding, the inner tubular electrode; wherein the inner tubular electrode extends axially towards a coating area at least until an end of the outer tubular electrode in the working direction, wherein at least one dielectric tubular wall extends axially between the inner tubular electrode and the outer tubular electrode, -wherein the at least one dielectric tubular wall supports the outer tubular electrode, wherein the at least one dielectric tubular wall extends axially beyond the outer tubular electrode in the working direction, and wherein the inner tubular electrode extends axially towards the coating area beyond the end of the outer tubular electrode and an end of the at least one dielectric tubular wall in the working direction; said method comprising:

moving the wired substrate and the precursor in the working direction through the inner tubular electrode while supplying the outer tubular electrode and the inner tubular electrode to a high voltage; and supplying a plasma gas between the outer tubular electrode and the inner tubular electrode, so as to produce a plasma excited gas that flows axially towards the coating area where the plasma excited gas chemically reacts with the precursor on the wired substrate.

15. The method according to claim 14, wherein the precursor is injected in a liquid or in a gaseous phase with a carrier gas.

16. The method according to claim 15, wherein a mixture of the precursor and the carrier gas is moving through the inner tubular wall at a gas speed inferior, equal or superior to a gas speed of the plasma gas and the plasma excited gas.

17. The method according to claim 14, wherein the wired substrate is dipped or sprayed or impregnated with the precursor before moving through the inner tubular electrode.

* * * * *